(12) United States Patent
Wilmart et al.

(10) Patent No.: US 11,038,319 B2
(45) Date of Patent: Jun. 15, 2021

(54) SEMICONDUCTOR LASER SOURCE

(71) Applicant: Commissariat A L'Energie Atomique et aux Energies Alternatives, Paris (FR)

(72) Inventors: Quentin Wilmart, Grenoble (FR); Karim Hassan, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 36 days.

(21) Appl. No.: 16/683,402

(22) Filed: Nov. 14, 2019

(65) Prior Publication Data

US 2020/0161831 A1 May 21, 2020

(30) Foreign Application Priority Data

Nov. 15, 2018 (FR) ..................................... 18 60519

(51) Int. Cl.
*H01S 5/00* (2006.01)
*H01S 5/10* (2021.01)
(Continued)

(52) U.S. Cl.
CPC ............ *H01S 5/1007* (2013.01); *G02F 1/225* (2013.01); *H01S 3/0637* (2013.01); *H01S 3/07* (2013.01);
(Continued)

(58) Field of Classification Search
CPC .... H01S 5/0652; H01S 5/0653; H01S 5/1071; H01S 5/026; H01S 5/1007; H01S 5/125;
(Continued)

(56) References Cited

U.S. PATENT DOCUMENTS

2003/0123784 A1   7/2003 Mukai
2005/0063042 A1*  3/2005 Morito ...................... H01S 5/50
                                                            359/334
(Continued)

FOREIGN PATENT DOCUMENTS

CN        103368678 B      8/2016
EP       3 065 237 A1      9/2016
WO    WO 2007/107187 A1    9/2007

OTHER PUBLICATIONS

French Preliminary Search Report dated Sep. 24, 2019 in French Application 18 60519 filed on Nov. 15, 2018 (with English Translation of Categories of Cited Documents & Written Opinion).

(Continued)

*Primary Examiner* — Kinam Park
(74) *Attorney, Agent, or Firm* — Oblon, McClelland, Maier & Neustadt, L.L.P.

(57) ABSTRACT

A semiconductor laser source including a Mach-Zehnder interferometer, this interferometer including first and second arms. Each of the arms is divided into a plurality of consecutive sections, the effective index of each section located immediately after a preceding section being different from the effective index of this preceding section. The lengths of the various sections meet the following condition:

$$\sum_{n=1}^{N_2} L_{2,n} neff_{2,n} - \sum_{n=1}^{N_1} L_{1,n} neff_{1,n} = k_f \lambda_{Si}$$

where: $k_f$ is a preset integer number higher than or equal to 1, $N_1$ and $N_2$ are the numbers of sections in the first and second arms, respectively, $L_{1,n}$ and $L_{2,n}$ are the lengths of the nth sections of the first and second arms, respectively, $neff_{1,n}$ and $neff_{2,n}$ are the effective indices of the nth sections of the (Continued)

first and second arms, respectively. The first and second arms each comprise a gain-generating section.

14 Claims, 5 Drawing Sheets

(51) Int. Cl.

| | | |
|---|---|---|
| G02F 1/225 | (2006.01) | |
| H01S 5/065 | (2006.01) | |
| H01S 3/07 | (2006.01) | |
| H01S 5/14 | (2006.01) | |
| H01S 5/026 | (2006.01) | |
| H01S 5/125 | (2006.01) | |
| H01S 5/02 | (2006.01) | |
| H01S 3/063 | (2006.01) | |
| G02F 1/21 | (2006.01) | |
| H01S 5/323 | (2006.01) | |
| H01S 5/343 | (2006.01) | |
| H01S 5/40 | (2006.01) | |
| H01S 5/30 | (2006.01) | |

(52) U.S. Cl.
CPC .............. *H01S 5/021* (2013.01); *H01S 5/026* (2013.01); *H01S 5/0652* (2013.01); *H01S 5/0653* (2013.01); *H01S 5/0654* (2013.01); *H01S 5/1032* (2013.01); *H01S 5/1071* (2013.01); *H01S 5/125* (2013.01); *H01S 5/141* (2013.01); *G02F 1/212* (2021.01); *H01S 5/3013* (2013.01); *H01S 5/3235* (2013.01); *H01S 5/34306* (2013.01); *H01S 5/4068* (2013.01)

(58) Field of Classification Search
CPC .... H01S 5/0654; H01S 5/1032; H01S 5/3013; H01S 5/3235; H01S 5/34306; H01S 5/4068; H01S 3/07; H01S 3/0637
See application file for complete search history.

(56) References Cited

U.S. PATENT DOCUMENTS

| | | | | |
|---|---|---|---|---|
| 2009/0174931 | A1* | 7/2009 | Huber | H01S 3/06791 |
| | | | | 359/340 |
| 2010/0085991 | A1* | 4/2010 | Okayama | H01S 5/026 |
| | | | | 372/20 |
| 2012/0057079 | A1 | 3/2012 | Dallesasse et al. | |
| 2014/0254617 | A1 | 9/2014 | Oh | |
| 2015/0139256 | A1* | 5/2015 | Dallesasse | H01S 5/021 |
| | | | | 372/20 |
| 2016/0170286 | A1* | 6/2016 | le Liepvre | H01S 5/142 |
| | | | | 385/2 |
| 2016/0261092 | A1* | 9/2016 | Tassaert | H01S 5/1032 |
| 2016/0301191 | A1 | 10/2016 | Orcutt | |
| 2016/0301477 | A1* | 10/2016 | Orcutt | H04B 10/506 |
| 2017/0026131 | A1* | 1/2017 | Orcutt | H01S 5/3013 |
| 2018/0261976 | A1* | 9/2018 | Menezo | H01S 5/06255 |
| 2018/0366915 | A1* | 12/2018 | Zilkie | G02B 6/29343 |

OTHER PUBLICATIONS

French Preliminary Search Report dated Sep. 24, 2019 in French Application 18 60520 filed on Nov. 15, 2018 (with English Translation of Categories of Cited Documents & Written Opinion).
Duan, G, et al., "Hybrid III-V on Silicon Lasers for Photonic Integrated Circuits on Silicon", IEEE Journal of Selected Topics in Quantum Electronics, vol. 20, No. 4, 2014, 13 pages.
Ciers, J, et al., "Near-UV narrow bandwidth optical gain in lattice-matched III-nitride waveguides", Japanese Journal of Applied Physics 57, 090305, 2018, 4 pages.
Bovington, J, et al., "Athermal laser design", Optics Express, vol. 22, No. 16, 2014, 8 pages.
Yariv, A, et al., "Supermode Si/III-V hybrid lasers, optical amplifiers and modulators: A proposal and analysis", Optics Express, vol. 15, No. 15, 2007, 5 pages.
Ben Bakir, B, et al., "Hybrid Si/III-V lasers with adiabatic coupling", 3 pages.
De Valicourt, G, et al., "Hybrid-Integrated Wavelength and Reflectivity Tunable III-V/Silicon Transmitter", Journal of Lightwave Technology, vol. 35, No. 8, 2017, 7 pages.
Hassan, K, et al., "Toward athermal silicon-on-insulator (de) multiplexers in the O-band", Optical Society of America, 2015, 5 pages.
Guha, B, et al., "CMOS-compatible athermal silicon microring resonators", Optics Express, vol. 18, No. 4, 2010, 7 pages.
Guha, B, et al., "Athermal silicon microring electro-optic modulator", Optics Letters, vol. 37, No. 12, 2012, 3 pags.
Guha, B, et al., "Minimizing temperature sensitivity of silicon Mach-Zehnder interferometers", Optics Express, vol. 18, No. 3, 2010, 9 pages.
Fitsios, D, et al., "High-gain 1.3μm GaInNAs semiconductor optical amplifier with enhanced temperature stability for all-optical signal processing at 10 Gb/s", Applied Optics, vol. 54, No. 1, 2015, 8 pages.

* cited by examiner

SEMICONDUCTOR LASER SOURCE

The invention relates to a semiconductor laser source configured to emit at a wavelength $\lambda_{Li}$ close to a desired wavelength $\lambda_{Si}$.

Known semiconductor laser sources comprise:
a set of waveguides optically coupled to one another and forming an optical cavity able to make an optical signal resonate at a plurality of possible resonant frequencies, the possible wavelengths $\lambda_{Rj}$ of these possible resonant frequencies being regularly spaced apart from one another by an interval $\Delta\lambda_R$, this set comprising:
at least one waveguide in which a bandpass filter is produced, the transmission spectrum of this bandpass filter comprising a passband able to select, among the various possible wavelengths $\lambda_{Rj}$, the wavelength $\lambda_{Li}$ closest to the wavelength $\lambda_{Si}$, and
at least one gain-generating waveguide able to generate optical gain at each wavelength $\lambda_{Li}$ selected by the bandpass filter, this gain-generating waveguide comprising a III-V gain medium.

Such a known laser source is for example disclosed in patent application US2018261976A.

Prior art is also known from US20140254617A1, US20030123784A1, CN103368678B, US2016301191A1, US2012057079A1 and WO2007107187A1.

Patent application US20140254617A1 discloses a bandpass filter containing a Mach-Zehnder interferometer. However, the arms of the Mach-Zehnder interferometer are devoid of gain-generating sections.

Patent application US20030123784A1 discloses a multimode demultiplexer using an interferometer.

Patent application CN103368678B describes an optical switch using a Mach-Zehnder interferometer. This optical switch is devoid of resonant cavity.

It is known that the wavelength $\lambda_{Li}$ of a semiconductor laser source varies as a function of temperature. It is desirable to limit this variation as much as possible. Many solutions have already been proposed to limit this variation. For example, in patent application US2018261976A, the bandpass filter of the laser source is made of silicon nitride in order to limit this variation as much as possible. However, the fabrication of the bandpass filter from silicon nitride complexifies the fabrication of the laser source.

It is also desirable to limit the bulk of such a semiconductor laser source as much as possible.

The invention aims to provide an architecture for the laser source that minimizes the length of the resonant cavity without however decreasing the power of the emitted optical signal. By way of secondary objective, the invention also aims to provide a laser source the variations in the emission wavelength $\lambda_{Li}$ of which as a function of temperature are limited without it being necessary to make the bandpass filter from a material other than silicon.

One of the subjects thereof is therefore a semiconductor laser source according to claim 1.

Embodiments of this laser source may comprise one or more of the features of the dependent claims.

The invention will be better understood on reading the following description, which is given merely by way of nonlimiting example with reference to the drawings, in which.

Figure 1:
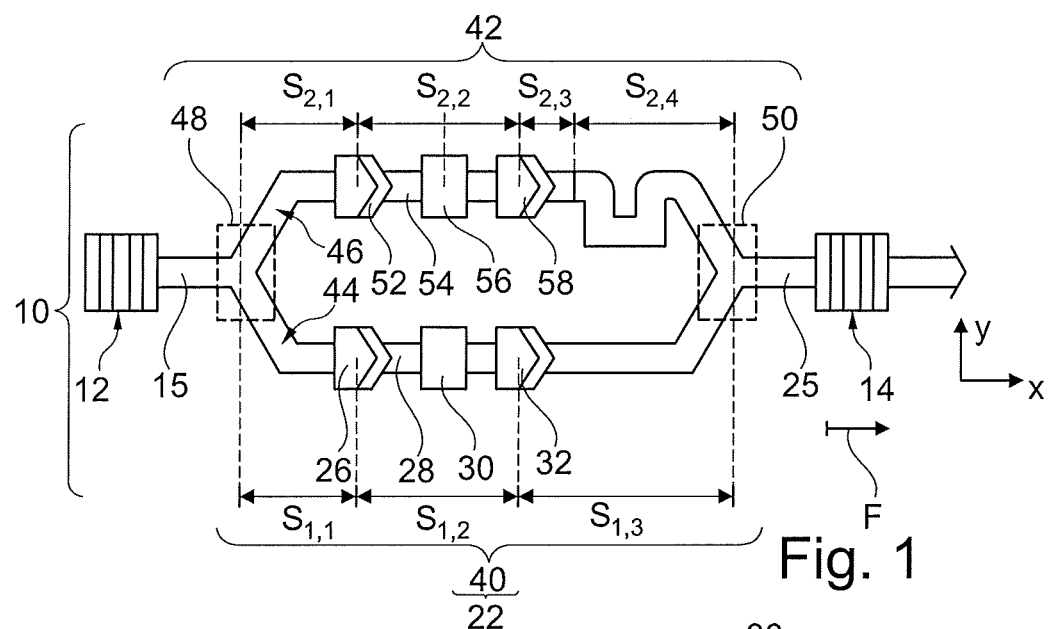
FIG. 1 is a schematic illustration, seen from above, of the architecture of a semiconductor laser source.

In these figures, the same references have been used to reference elements that are the same. In the rest of this description, features and functions well known to those skilled in the art will not be described in detail.

SECTION I: DEFINITIONS AND NOTATIONS

The wavelength $\lambda_{Li}$ is the wavelength at which the laser source emits. When the laser source is a monomode or monochromatic laser source, there is only a single wavelength $\lambda_{Li}$. When the laser source is a multimode or polychromatic laser source, a plurality of different wavelengths $\lambda_{Li}$ exist simultaneously. In the latter case, the index i is an identifier of the wavelength $\lambda_{Li}$ among the various wavelengths at which the laser source emits. Typically, the wavelength $\lambda_{Li}$ is comprised between 1250 nm and 1590 nm.

The wavelengths $\lambda_{Rj}$ are the various wavelengths at which a resonant cavity is capable of resonating in the absence of bandpass filter. The bandpass filter is the filter that selects a small number of wavelengths $\lambda_{Rj}$. These wavelengths $\lambda_{Rj}$ are regularly spaced apart from one another by an interval $\Delta\lambda_R$. The index j is an identifier of one particular wavelength $\lambda_{Rj}$.

The interval $\Delta R$ is the smallest wavelength range containing all the possible wavelengths $\lambda_{Rj}$. Typically, when the resonant cavity is bounded by reflectors of optical signals, the interval $\Delta R$ is equal to the reflective band of these reflectors. The interval $\Delta R$ may also be limited by the width of the amplification band or "gain band" of the optical amplifier used to amplify the optical signals that resonate in the interior of the cavity. The gain band is a frequency band that contains all the frequencies of the optical signals capable of being amplified by the optical amplifier. Optical signals the frequencies of which are outside of this gain band are not amplified by the optical amplifier.

The reflective band of a reflector is the −3 dB reflective band. It is a question of the wavelength range containing all the wavelengths $\lambda_{Rj}$ able to be reflected by the reflector with a power higher than or equal to 50% of the maximum power $I_{max}$ reflected by this reflector. The power $I_{max}$ is equal to the power of the reflected optical signal for the wavelength $\lambda_{Rj}$, at which this power is maximum.

The wavelength $\lambda_{CR}$ is a wavelength corresponding to a maximum of the reflection spectrum of the reflector. Typically, the wavelength $\lambda_{CR}$ is the wavelength located at the middle of the reflective band of the reflector. This wavelength $\lambda_{CR}$ moves at the same time as the reflective band moves.

Here, the widths of the passbands are the widths of the −3 dB passbands. Below, the width of the passband of a filter is denoted $\Delta\lambda_{FX}$, where the index FX is an identifier of the filter.

The wavelength that corresponds to a maximum in the transmission spectrum of a filter is denoted $\lambda_{CFX}$ where the index FX is an identifier of the filter. Typically, the wavelength $\lambda_{CFX}$ is the wavelength located at the middle of a passband of the filter.

The distance between the maximums of two successive passbands of the transmission spectrum of a bandpass filter is denoted $d_{FSRX}$, where the index FX is an identifier of the filter. This distance is known as free spectral range (FSR).

By "athermal" filter, what is meant is the fact that the coefficient $d\lambda_{CFX}/dT$ associated with this filter is comprised between $L_{min}$ and $L_{max}$, where:
- $\lambda_{CFX}$ is the wavelength that corresponds to a maximum in the transmission spectrum of the filter,
- the coefficient $d\lambda_{CFX}/dT$ is the variation in the wavelength $\lambda_{CFX}$ as a function of temperature,
- $L_{min}$ is equal to $-50$ pm/° C. and, preferably, equal to $-15$ pm/° C. or $-7$ pm/° C., and
- $L_{max}$ is equal to $+50$ pm/° C. and, preferably, equal to $+15$ pm/° C. or $+7$ pm/° C.

For a given filter, the coefficient $d\lambda_{CFX}/dT$ may be determined experimentally or by numerical simulation. For example, the variation in the wavelength $\lambda_{CFX}$ as a function of temperature is measured or simulated in a temperature range extending from 20° C. to 100° C. Typically, the wavelength $\lambda_{CFX}$ varies approximately linearly as a function of temperature in this temperature range. It is therefore possible to approximate the relationship that relates the wavelength $\lambda_{CFX}$ to the temperature T in this range using the following linear relationship: $\lambda_{CFX}=aT+b$, where the coefficients a and b are constants. The values of the coefficients a and b are established by determining the straight line that minimizes the deviations, for example in the least-squares sense, between this straight line and each measured or simulated point. Each measured or simulated point has as abscissa a temperature and as ordinate the wavelength $\lambda_{CFX}$ measured or obtained by simulation for this temperature. The value of the coefficient $d\lambda_{CFX}/dT$ is then set equal to the value of the coefficient a.

The thermo-optical coefficient of a material is the coefficient $dn_r/dT$, where:
- $n_r$ is the refractive index of this material at the wavelength $\lambda_{Si}$, and
- $dn_r/dT$ is the variation in the refractive index $n_r$ as a function of temperature in a temperature range extending from 20° C. to 100° C.

Similarly to what was indicated for the coefficient $d\lambda_{CFX}/dT$, the coefficient $dn_r/dT$ is approximated by a constant in the temperature range extending from 20° C. to 100° C.

SECTION II: EXAMPLES OF EMBODIMENTS

FIG. 1 schematically shows the general architecture of a semiconductor laser source 10 that emits at at least one wavelength $\lambda_{Li}$ that is as close as possible to a desired wavelength $\lambda_{Si}$. The wavelength $\lambda_{Si}$ is constant and either set once and for all during the design of the laser source or adjustable by a user. In any case, once set, the wavelength $\lambda_{Si}$ remains constant provided that the settings of the laser source are not modified.

Below, only the particularities of the laser source 10 are described in detail. For general information on the production and operation of a semiconductor laser source using waveguides made of silicon and of a III-V gain medium, the reader may consult the following article: B. Ben Bakir et al., "Hybrid Si/III-V lasers with adiabatic coupling", 2011.

The laser source 10 comprises a back reflector 12 and a front reflector 14 that define the ends of a Fabry-Pérot resonant cavity. In the interior of this cavity, an optical signal may resonate, in the absence of bandpass filter, at a plurality of possible wavelengths $\lambda_{Rj}$. The wavelengths $\lambda_{Rj}$ are regularly spaced apart from one another by an interval $\Delta\lambda_R$. In this embodiment, the interval $\Delta R$ that contains all the wavelengths $\lambda_{Rj}$ is equal to the reflective band of the reflectors 12 and 14.

For example, the reflector 12 has a reflectance strictly higher than that of the reflector 14. The reflectance is equal to the ratio of the power of the optical signal reflected by the reflector to the power of the optical signal incident on this reflector. Typically, the reflectance of the reflector 12 is higher than or equal to 90% or 95% for the wavelength $\lambda_{Li}$. The reflectance of the reflector 14 is generally comprised between 30% and 80% and is typically equal to 50%.

The reflectors 12 and 14 are wideband reflectors. In this embodiment, this means that the width of the reflective band of the reflectors 12 and 14 is larger than a preset lower limit. This lower limit is here:
- equal to $\Delta\lambda_f+DT\cdot(d\lambda_{CR}/dT)$ if the bandpass filter is arranged to select solely a single wavelength $\lambda_{Li}$, and
- equal to $\Delta\lambda_f+\max\{DT\cdot(d\lambda_{CR}/dT); N\cdot d_{SFRf}+DT\cdot(d\lambda_{Cf}/dT)\}$ if the bandpass filter is arranged to select N wavelengths $\lambda_{Li}$, where:
- $\Delta\lambda_1$ is the width of the passband of the bandpass filter of the laser source,
- DT is the width of a preset operating temperature range of the laser source,
- $d\lambda_{CR}/dT$ is the variation in the central wavelength $\lambda_{CR}$ of the reflectors as a function of temperature expressed in nm/° C.,
- $d\lambda_{Cf}/dT$ is the variation in the central wavelength $\lambda_{Cf}$ of the bandpass filter as a function of temperature expressed in nm/° C.,
- N is an integer number higher than or equal to two,
- $d_{SFRf}$ is the interval between two successive passbands of the bandpass filter expressed in nanometres,
- the symbol "." designates in this description the operation of scalar multiplication, and
- $\max\{\ldots\}$ is the function that returns the highest of the elements that are located between the curly brackets and that are separated from each other by a semi-colon.

Various embodiments of the bandpass filter of the laser source are described below.

The operating temperature range of a laser source is often chosen higher than 10° C. or 30° C. Here the operating temperature range is chosen as being comprised between +20° C. and +100° C. The width DT is therefore here equal to 80° C. Below, the lowest and highest temperatures of the operating temperature range are denoted $T_{min}$ and $T_{max}$, respectively. In this embodiment, the reflectors 12 and 14 are produced in a waveguide the core of which is made of silicon. Thus, the variation $d\lambda_{CR}/dT$ is here equal to 0.07 nm/° C. Typically, the width of the reflective band is larger than 6 nm or 15 nm or 30 nm.

The reflectors 12 and 14 are also designed so that, at the temperature $T_{min}$, the wavelength $\lambda_{Li}$ is closer to the upper limit $\lambda_{Rmax}$ of the reflective band of the reflectors 12 and 14 than to its lower limit $\lambda_{Rmin}$. For example, at the temperature $T_{min}$, the wavelength $\lambda_{Li}$ is comprised between $0.9\,\lambda_{Rmax}$ and $\lambda_{Rmax}$. This constraint may be relaxed if the width of the reflective band is very much larger than its lower limit such as defined above.

Here, the reflectors 12 and 14 are for example Bragg gratings.

Between the reflectors 12 and 14, the laser source includes in succession the following photonic components in order from the reflector 12 to the reflector 14:

an optical waveguide 15 made of silicon in which the reflector 12 is produced, a bandpass filter 22 able to select the wavelength $\lambda_{Li}$ of operation of the laser source 10 from the various wavelengths $\lambda_{Rj}$ that are able to be supported in the interior of the Fabry-Pérot cavity, a coupler 26 that optically connects the waveguide 15 to an entrance of a waveguide 28 made of III-V gain medium, a semiconductor optical amplifier 30 (SOA) produced in the waveguide 28 and able to generate and to amplify the optical signal resonating in the interior of the Fabry-Pérot cavity at each of the wavelengths $\lambda_{Rj}$, a coupler 32 that optically connects an exit of the waveguide 28 to a waveguide 25, and the optical waveguide 25 made of silicon in which the reflector 14 is produced.

Here, by waveguide made of silicon, what is meant is a waveguide the core of which is made of silicon. For example, the cladding of the waveguides made of silicon is made from another material such as, typically, silicon oxide.

The couplers 26 and 32 are for example adiabatic couplers. For a detailed description of an adiabatic coupler, the reader is referred to the following article: Amnon Yariv et al., "Supermode Si/III-V hybrid Lasers, optical amplifiers and modulators: proposal and analysis" Optics Express 9147, vol. 14, No. 15, 23 Jul. 2007.

Such an adiabatic coupler is, for example, obtained by modifying the width of the waveguide made of silicon with respect to the width of the waveguide made of III-V gain medium. Typically, for an adiabatic coupling of a waveguide made of silicon to a waveguide made of III-V material, the width of the waveguide made of silicon is gradually decreased as the waveguide made of III-V material is approached. In the opposite direction, to transfer by adiabatic coupling an optical signal from the waveguide made of III-V material to a waveguide made of silicon, the width of the waveguide made of silicon is for example gradually increased. In addition, typically toward the middle of the adiabatic coupler, the dimensions of the cross sections of the waveguides made of silicon and made of III-V material are generally such that their respective effective indices are equal. This is also true for an adiabatic coupling between hybrid Si/III-V material waveguides.

Preferably, the amplifier 30 is a wideband amplifier, i.e. one capable of generating and amplifying a large range of wavelengths. This range comprises the wavelength $\lambda_{Si}$. Typically, it is centred on this wavelength $\lambda_{Si}$ at the temperature $(T_{max}+T_{min})/2$. The width of this wavelength range at −3 dB is for example at least 10 nm or 25 nm or 35 nm and remains wide with the increase in temperature. For example, the III-V materials from which the amplifier 30 is made are those described in the following article: Dimitris Fitsios et al. "High-gain 1.3 μm GaInNAs semiconductor optical amplifier with enhanced temperature stability for all-optical processing at 10 Gb/s", Applied Optics, vol. 54, n° 1, 1 Jan. 2015. The fact of producing the amplifier 30 as described in this article in addition allows a wideband amplifier that is stable in temperature to be obtained. This improves the operation of the laser source and notably this allows the power emitted by the laser source to be kept almost constant in all the operating temperature range [$T_{min}$; $T_{max}$]. In this case, the waveguide 28 and the amplifier 30 take the form of a stack 34 (FIG. 2) of alternating sublayers made of GaInNAs and of GaNAs interposed between a lower sublayer 35 (FIG. 2) and an upper sublayer 36 (FIG. 2) made of p-doped GaAs. The sublayer 35 is a sublayer made of III-V material of opposite dopant type to the upper layer 36. Here, it is a question of a sublayer made of n-doped GaAs.

The amplifier 30 comprises, in addition to the waveguide 28, a connection 37 (FIG. 2) making direct mechanical and electrical contact with the segment of the sublayer 35. The sublayer 36 makes mechanical and electrical contact with a connection 38 (FIG. 2) in order to electrically connect the lower portion of the amplifier 30 to a potential. When a DC current, called the "injection current", higher than the threshold current of the laser is applied between the connections 37 and 38, the amplifier 30 generates and amplifies the optical signal that resonates in the interior of the Fabry-Pérot cavity.

In this embodiment, the filter 22 comprises solely an athermal primary filter 40. The filter 40 is here composed of a Mach-Zehnder interferometer 42.

The interferometer 42 comprises:

two arms 44 and 46 that are each able to guide the resonant optical signal, and two forks 48 and 50.

In the direction of propagation F (FIG. 1) of the optical signal travelling from the reflector 12 to the reflector 14, the fork 48 distributes equally the optical signal reflected by the reflector 12 to the arms 44 and 46.

In FIG. 1 and the following figures, the vertical direction has been represented by a direction Z of an orthogonal coordinate system XYZ, where X and Y are horizontal directions. Here, the direction X is essentially parallel to the direction F of propagation of the optical signal.

In the direction F, the fork 50 combines the optical signals output from the arms 44 and 46 together to obtain an optical signal that propagates in the waveguide 25 to the reflector 14. In the direction of propagation opposite to the direction F, the roles of the forks 48 and 50 are inverted. For example, the forks 48 and 50 are multi-mode interferometers (MMIs).

The arm 44 is divided into three consecutive sections $S_{1,1}$, $S_{1,2}$ and $S_{1,3}$ in order in the direction F. Below, section n of arm m is designated $S_{m,n}$, where:

the index m is an identifier of the arm of the interferometer, and the index n is an identifier of the section of this arm.

In this text, when the index m is equal to 1, this designates the lower arm 44. When the index m is equal to 2, this designates the upper arm 46. The index n is the numerical order of the section, starting at the fork 48 and travelling in the direction F. Thus, an index n equal to 1 corresponds to the first section encountered after the fork 48, the index n equal to 2 corresponds to the second section encountered starting from the fork 48 and so on.

Each section $S_{m,n}$ is a waveguide. Each of these sections therefore has an effective index $Neff_{m,n}$ and a nonzero length $L_{m,n}$. Typically, each section differs from the section that precedes it and from the section that follows it in:

the dimensions of its cross section, the one or more materials used to produce its core, and/or the one or more materials used to produce its cladding.

The effective index of a waveguide depends on the materials used to form the core and the cladding of this waveguide and also on the dimensions of the core and notably on the width and thickness of the core. The effective indices of two successive sections in the direction F are therefore different. Here, the effective index Neff$_{m,n}$ of each section S$_{m,n}$ is considered to be constant over all its length L$_{m,n}$.

The effective index of a waveguide may be determined, for a given temperature and for a given wavelength, by numerical simulation or experimentally. Here, when the effective indices of various sections are compared, it is a question of the effective indices determined at the same temperature and at the same wavelength. Typically, this wavelength is equal to $\lambda_{Si}$.

The effective index of a waveguide varies as a function of the temperature of this waveguide. Below, the coefficient that expresses the degree of variation in the index neff, of the section S$_{m,n}$ as a function of temperature is denoted dneff$_{m,n}$/dT. To a first approximation, in the temperature range DT, this coefficient dneff$_{m,n}$/dT may be considered to be constant.

Here, the section S$_{1,1}$ extends from the fork 48 to the coupler 26. The section S$_{1,1}$ is a waveguide made of silicon.

The section S$_{1,2}$ extends from the coupler 26 to the coupler 32. The section S$_{1,2}$ therefore corresponds to the waveguide 28 made of III-V gain media, in which waveguide the amplifier 30 is produced. The section S$_{1,2}$ is here called the "gain-generating section" because it has the capacity to amplify the optical signal.

The section S$_{1,3}$ extends from the coupler 32 to the fork 50. The section S$_{1,3}$ is a waveguide made of silicon that is identical to the waveguide made of silicon of section S$_{1,1}$ except that the length L$_{1,3}$ made it be different from the length L$_{1,1}$.

The arm 46 is divided into four consecutive sections S$_{2,1}$, S$_{2,2}$, S$_{2,3}$ and S$_{2,4}$ in order in the direction F. The sections S$_{2,1}$ and S$_{2,2}$ are identical to the sections S$_{1,1}$ and S$_{1,2}$, respectively. The arm 46 therefore comprises, just like the arm 44:

- an optical coupler 52 that optically connects the waveguide 15 to an entrance of the waveguide 54 made of III-V gain media,
- an optical amplifier 56 produced in the waveguide 54, and
- an optical coupler 58 that optically connects an exit of the waveguide 54 to the waveguide 25.

The couplers 52, 58, the waveguide 54 and the amplifier 56 are identical to the couplers 26, 32, to the waveguide 28 and to the amplifier 30, respectively. In addition, the injection current that flows through the amplifier 56 here systematically has the same magnitude as the injection current that flows through the amplifier 30 at the same time. For example, to this end, the lower sublayer 35 and upper sublayer 36 of the amplifier 30 and of the amplifier 56 are common to these two amplifiers or are directly electrically connected to each other. Under these conditions, the indices neff$_{1,2}$ and neff$_{2,2}$ are identical and the coefficients dneff$_{1,2}$/dT and dneff$_{2,2}$/dT are also identical.

The section S$_{2,4}$ is identical to the section S$_{1,3}$ except that its length L$_{2,4}$ is larger than the length L$_{1,3}$. In FIG. 1, the fact that the length L$_{2,4}$ is larger than the length L$_{1,3}$ is schematically represented by a zigzag.

The section S$_{2,3}$ has a coefficient dneff$_{2,3}$/dT lower than the coefficients dneff$_{2,1}$/dT, dneff$_{2,2}$/dT and dneff$_{2,4}$/dT. To this end, according to a first solution, section S$_{2,3}$ is a waveguide made of silicon the width of the core of which is smaller than the width of the core of sections S$_{2,1}$ and S$_{2,4}$. According to a second solution, section S$_{2,3}$ is a waveguide the core of which is made from a material different from silicon such as, for example silicon nitride. In this case, the dimensions of the core of section S$_{2,3}$ may be identical to the dimensions of the cores made of silicon of sections S$_{2,1}$ and S$_{2,4}$. A third solution consists in using an another material for the cladding of section S$_{2,3}$, this material being different from that used for the cladding of sections S$_{2,1}$ and S$_{2,4}$. In addition, it is possible to combine these various solutions to obtain the desired coefficient dneff$_{2,3}$/dT.

In order for the interferometer 42 to have a passband that allows the wavelength $\lambda_{Li}$ to be selected, the sections S$_{m,n}$ are configured to meet the following condition (1):

$$\sum_{n=1}^{N_2} L_{2,n} neff_{2,n} - \sum_{n=1}^{N_1} L_{1,n} neff_{1,n} = k_f \lambda_{Si}$$

where:
- $k_f$ is a preset integer number higher than or equal to 1,
- $N_1$ and $N_2$ are the numbers of sections in the arms 44 and 46, respectively,
- $L_{1,n}$ and $L_{2,n}$ are the lengths of the nth sections of the arms 44 and 46, respectively,
- neff$_{1,n}$ and neff$_{2,n}$ are the effective indices of the nth sections of the arms 44 and 46, respectively.

A high number of lengths L$_{m,n}$ and of indices Neff$_{m,n}$ allow condition (1) to be satisfied.

Here, the filter 40 is also to designed to be athermal. Thus its coefficient d$\lambda_{CF1}$/dT is close to zero, i.e. comprised between L$_{min}$ and L$_{max}$. Below, a wavelength corresponding to a maximum of the transmission spectrum of the primary filter 40 is denoted $\lambda_{CF1}$. To this end, the sections S$_{m,n}$ are configured to also meet the following condition (2):

$$L_{min} \le \sum_{n=1}^{N_2} L_{2,n} \frac{dneff_{2,n}}{dT} - \sum_{n=1}^{N_1} L_{1,n} \frac{dneff_{1,n}}{dT} \le L_{max}$$

where dneff$_{1,n}$/dT and dneff$_{2,n}$/dT are the variations in the effective indices of the nth sections of the arms 44 and 46, respectively.

For example, here the lengths L$_{m,n}$ and the coefficients dneff$_{m,n}$/dT meet condition (2) with L$_{min}$=−7 pm/° C. and L$_{max}$=+7 pm/° C. and, preferably, with L$_{min}$=−2 pm/° C. and L$_{max}$=+2 pm/° C.

There are a high number of sets of values for the lengths L$_{m,n}$ and the indices neff$_{m,n}$ that meet both of the above conditions (1) and (2). Here, among all of these sets, it is the set of values or one of the sets of values that in addition allows a width $\Delta\lambda_{40}$ to be obtained for the passband of the primary filter 40 larger than $\Delta\lambda_R$ that is chosen.

Under these conditions, because the interferometer 42 meets condition (2), the passband of the filter 22 does not move or practically does not move as a function of temperature. In contrast, in this embodiment, the wavelengths $\lambda_{Rj}$ move as a function of temperature. In particular, the variation in temperature may be such that a wavelength $\lambda_{Rj}$ precedingly located in the interior of the passband of the filter 22 moves and exits from this passband. In this case, since the width $\Delta\lambda_{40}$ is larger than or equal to the interval $\Delta\lambda_R$, when a wavelength $\lambda_{Rj}$ exits from the passband of the filter 22, another wavelength $\lambda_{Rj-1}$ or $\lambda_{Rj+1}$ enters into the interior of this passband. Thus, in this embodiment, it is not necessary to employ a tuning device that moves the wavelengths $\lambda_{Rj}$ so that there permanently exists a wavelength $\lambda_{Rj}$ located at the centre of the passband of the filter 22.

To configure the sections S$_{m,n}$ so that they meet the various above conditions, one solution consists, in a first step, in choosing the transverse dimensions of each section and the materials used for the core and the cladding of each section. Thus, the effective indices $neff_{m,n}$ and the coefficients $dneff_{m,n}/dT$ of each section are defined. Next, in a second step, the lengths $L_{m,n}$ allowing the various preceding conditions to be met are sought. If it proves to be impossible to find satisfactory lengths, then the method returns to the first step in order to modify the effective indices of one or more sections. Such sections are for example dimensioned in accordance with the teaching given, in a different context, in the following article: Biswajeet Guha et al: "Minimizing temperature sensitivity of silicon Mach-Zehnder interferometers", Optics Express, 15/01/2010, pages 1879-1887.

Figure 2:
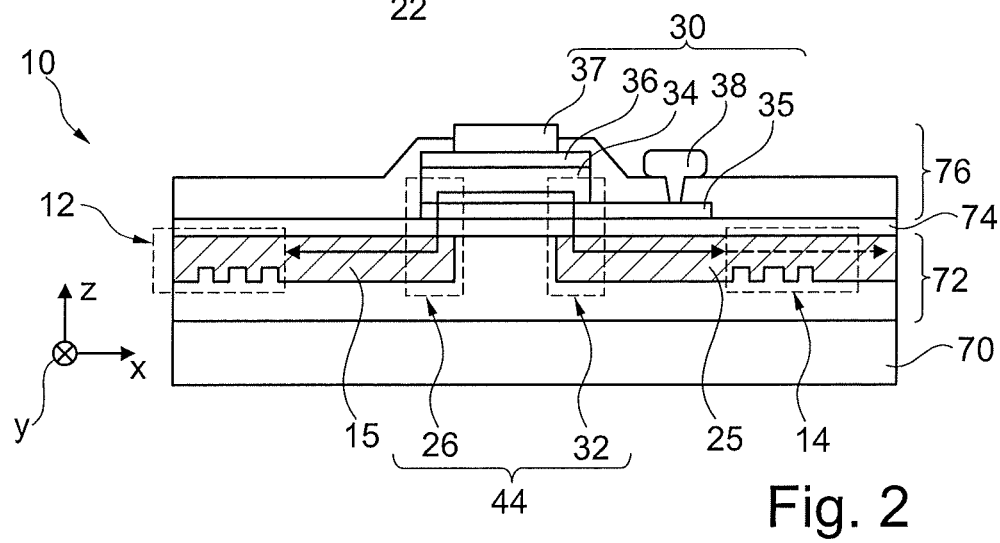
FIG. 2 is a schematic illustration in vertical cross section of the laser source of FIG. 1.

FIG. 2 shows the laser source 10 in a vertical cross section passing through the arm 44. In this figure, the path followed by the optical signal between the reflectors 12 and 14 is represented by a double-headed arrow.

The laser source 10 comprises a substrate 70 that mainly lies in a horizontal plane called the "plane of the substrate". The thickness of the substrate 70 is for example larger than 500 μm.

A layer 72 of single-crystal silicon encapsulated in silicon oxide is stacked on the upper face of the substrate 70. The reflectors 12 and 14, the waveguides 15 and 25 and the sections $S_{1,1}$, $S_{1,3}$, $S_{2,1}$, $S_{2,3}$ and $S_{2,4}$ and the lower portions of the couplers 26, 32, 52 and 58 are produced in the encapsulated silicon of this layer 72.

A thin layer 74, for example made of silicon oxide, is deposited on the layer 72. Lastly, the laser source 10 comprises a layer 76 made of gain medium encapsulated in, for example, silicon oxide. The waveguides 28 and 54, the amplifiers 30 and 56 and the upper portions of the couplers 26, 32, 52 and 58 are produced in this layer 76.

Figure 3:
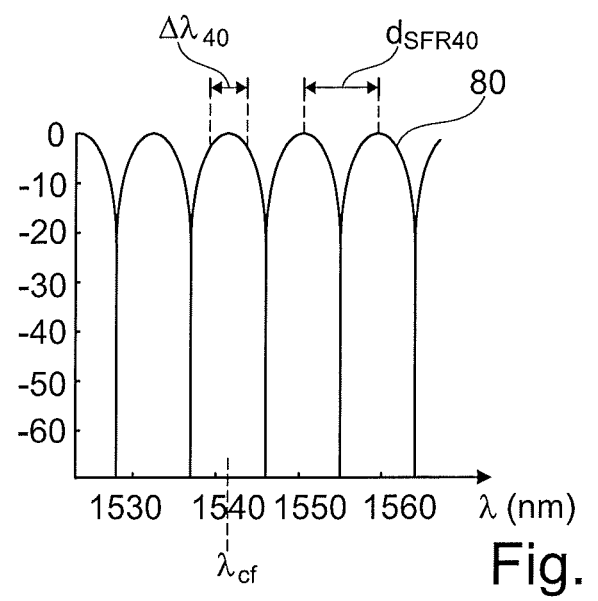
FIG. 3 is a graph illustrating the transmission spectrum of a bandpass filter of the laser source of FIG. 1.

FIG. 3 shows the transmission spectrum 80 of the primary filter 40. The ordinate axis represents the transmittance of the filter 40 and the abscissa axis the wavelength associated with this transmittance. In this figure and the other figures showing a transmission spectrum, the transmittance of the filter is plotted on a logarithmic scale. Thus, a maximum of the transmission spectrum corresponds to the value 0 or to a value close to 0 in these graphs. In this example, the width $\Delta\lambda_{40}$ of a passband of the filter 40 is for example 5 nm. Since this width $\Delta\lambda_{40}$ is larger than the interval $\Delta\lambda_R$, the laser source 10 is multimode.

Figure 4:
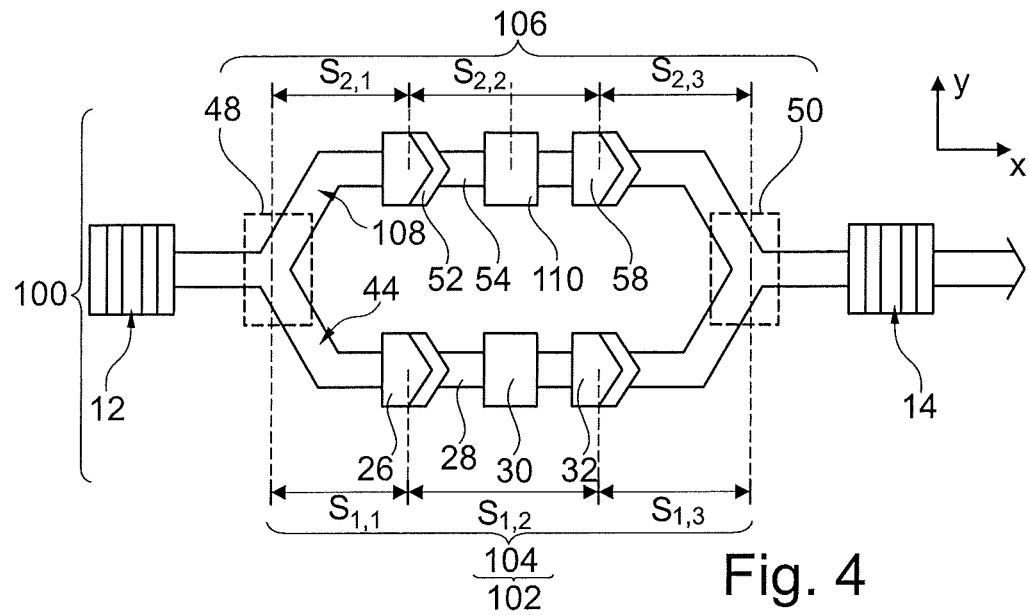
FIGS. 4, 5, 8, 10, 11, 13 and 15 are schematic illustrations, seen from above, of various other possible architectures of the laser source of FIG. 1.

FIG. 4 shows a laser source 100 that is identical to the laser source 10, except that the filter 22 has been replaced by a filter 102. The filter 102 is identical to the filter 22, except that the primary filter 40 has been replaced by a primary filter 104 that comprises an interferometer 106 instead of the interferometer 42. The interferometer 106 is identical to the interferometer 42 except that the arm 46 has been replaced by an arm 108.

The arm 108 is identical to the arm 46 except that it comprises only three sections $S_{2,1}$, $S_{2,2}$ and $S_{2,3}$. Section $S_{2,1}$ of the arm 108 is identical to section $S_{1,1}$ of the arm 44. Section $S_{2,2}$ is identical to section $S_{2,2}$ of the interferometer 42 except that the amplifier 56 has been replaced by an amplifier 110 shorter than the amplifier 30. Thus, the length $L_{2,2}$ of section $S_{2,2}$ of the arm 108 is shorter than the length $L_{1,2}$. Section $S_{2,3}$ is identical to section $S_{1,3}$ except that the length $L_{2,3}$ is larger than or equal to the length $L_{1,3}$.

As in the preceding embodiment, the various sections $S_{m,n}$ are arranged so that the lengths $L_{m,n}$ and the indices $neff_{m,n}$ meet both of conditions (1) and (2) described above. This laser source 100 operates just like the laser source 10 but without it being necessary to implement an additional section in one of the arms the effective index of which is lower than the indices $neff_{2,1}$ and $neff_{2,2}$.

Figure 5:
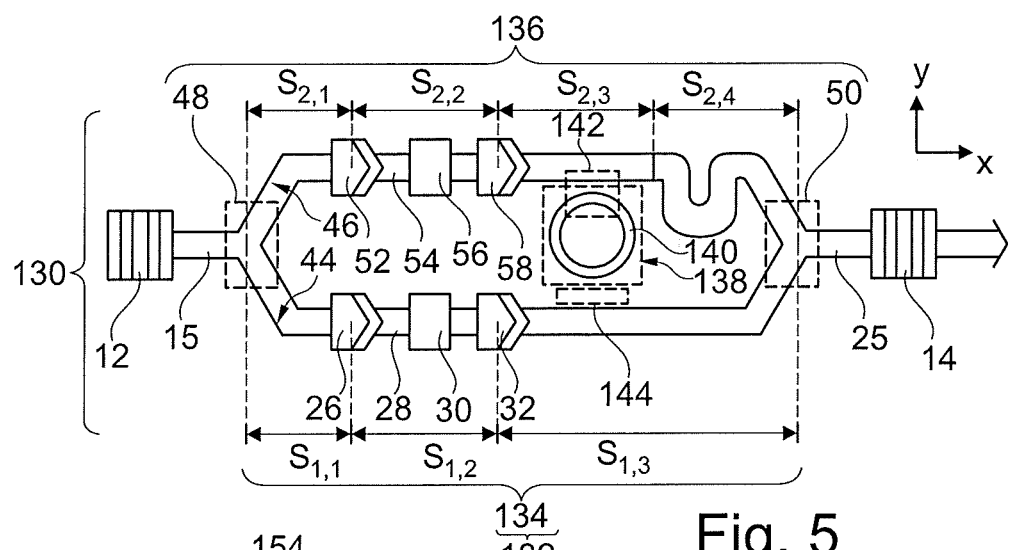

FIG. 5 shows a laser source 130 that is identical to the laser source 10, except that the filter 22 has been replaced by a filter 132 that comprises a primary filter 134 instead of the primary filter 40. The filter 134 comprises a Mach-Zehnder interferometer 136 and a secondary filter 138.

The filter 138 is a bandpass filter typically comprising a plurality of passbands. The width $\Delta\lambda_{138}$ of each of these passbands is smaller than or equal to the interval $\Delta\lambda_R$. Here, the width $\Delta\lambda_{138}$ is equal to $\Delta\lambda_R$. This filter 138 has a coefficient $dneff_{138}/dT$ higher than zero and generally higher than 15 pm/° C. or 50 pm/° C., where $neff_{138}$ is the effective index of the waveguide in which the filter 138 is produced. Here, the filter 138 is formed in a waveguide made of silicon. Thus, its coefficient $dneff_{138}/dT$ is higher than 50 pm/° C.

In this embodiment, the filter 138 comprises a ring resonator 140. The ring 140 is optically coupled to section $S_{2,3}$ of the arm 46 by way of an optical coupling 142. Thus, a portion of the optical signal that passes through the arm 46 also passes through the filter 138. The coupling 142 is for example an evanescent coupling.

Figure 6:
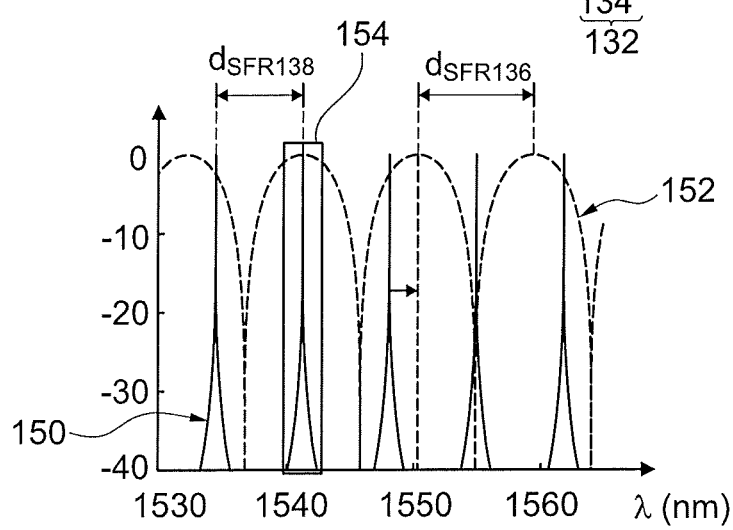
FIGS. 6 and 7 are graphs illustrating transmission spectra of filters of the laser source of FIG. 5.

FIG. 6 shows the transmission spectrum 150 of the filter 138. This spectrum 150 comprises a plurality of passbands that are regularly spaced apart from one another by the distance $d_{FSR138}$. FIG. 6 also shows the transmission spectrum 152 of the interferometer 136. The spectrum 152 presents a plurality of transmission maximums that are regularly spaced apart from one another by the distance $d_{FSR136}$.

Here, the filter 138 is arranged so that the distance $d_{FSR138}$ is such that at a given time, in the interior of the interval $\Delta R$, it is possible for there to be only a single passband of the filter 138 centred on a transmission maximum of the spectrum 152. To achieve this, either the filter 138 is configured so that the distance $d_{FSR138}$ is larger than $\Delta R$ or the filter 138 is configured so that the distance $d_{FSR138}$ is a non-integer multiple of the distance $d_{FSR136}$, as shown in FIG. 6. In FIG. 6, this band of the filter 138 centred on a transmission maximum of the spectrum 152 has been framed by a rectangle 154. Under these conditions, the filter 132 selects a single wavelength $\lambda_{Li}$ contained in the interior of the passband framed by the rectangle 154. The laser source 130 is therefore a monomode laser source.

Here, the interferometer 136 is identical to the interferometer 42 except that the various sections $S_{m,n}$ are arranged so as to meet condition (1) and the following condition (3):

$$L_{min} - \frac{dneff_{138}}{dT} \leq \sum_{n=1}^{N_2} L_{2,n}\frac{dneff_{2,n}}{dT} - \sum_{n=1}^{N_1} L_{1,n}\frac{dneff_{1,n}}{dT} \leq L_{max} - \frac{dneff_{138}}{dT}$$

In this embodiment, condition (2) is replaced by condition (3) above. When conditions (1) and (3) are met, the interferometer 136 compensates to a large extent the movement of the transmission spectrum of the filter 138 due to the temperature variations. The filter 134, which combines this interferometer 136 and the filter 138, is therefore athermal. Such sections are for example dimensioned in accordance with the teaching given, in a different context, in the following article: Biswajeet Guha et Al: "CMOS-compatible athermal silicon microring resonators", Optics Express, Mar. 2, 2010, pages 3487-3493.

Figure 7:
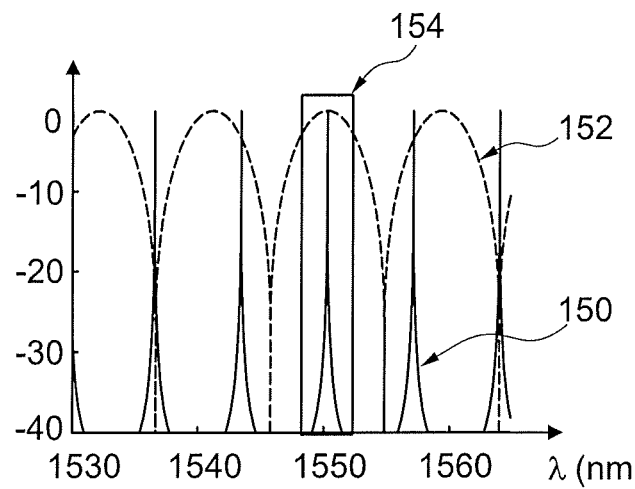

Here, the filter 134 also comprises a device 144 for adjusting the position of the passbands of the filter 138 with respect to the transmission maximum of the spectrum 152. For example, the device 144 is a heater able to locally heat the ring 140 without heating the arms 44 and 46 of the interferometer 136. As illustrated in FIG. 7, this device 144 allows the spectrum 150 to be moved with respect to the spectrum 152 until another passband of the filter 138 is centred on a transmission maximum of the spectrum 152. This allows, with a small movement of the spectrum 150, the value of the desired wavelength $\lambda_{Si}$ of the laser source 130 to be substantially changed. In the example of FIGS. 6 and 7, a movement of less than 4 nm of the spectrum 150 allows the value of the wavelength $\lambda_{Si}$ to be made to vary by about 10 nm.

Figure 8:
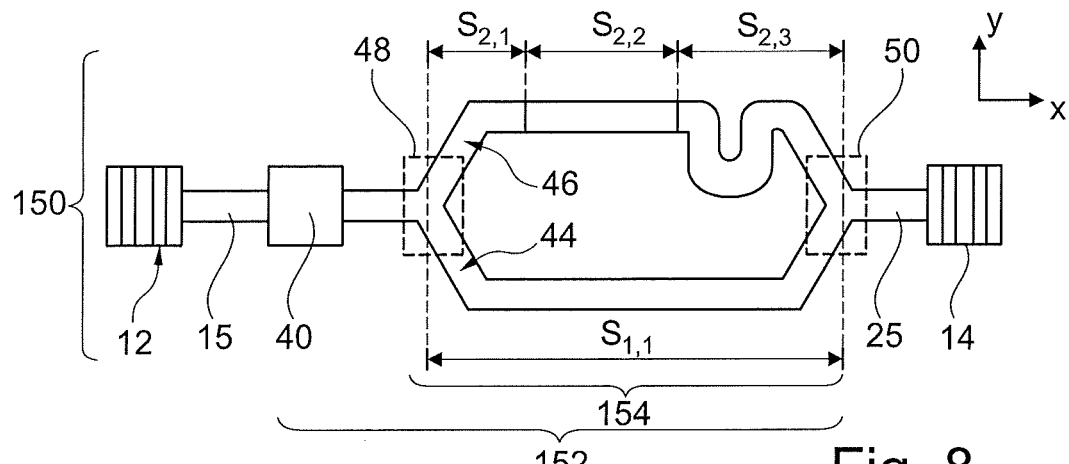

FIG. 8 shows a laser source 150 that is identical to the laser source 10, except that the filter 22 has been replaced by a filter 152 that comprises, in addition to the primary filter 40, a tertiary filter 154 that is optically connected in series with the filter 40. To simplify FIG. 8, the details of the filter 40 have not been illustrated again.

Figure 9:
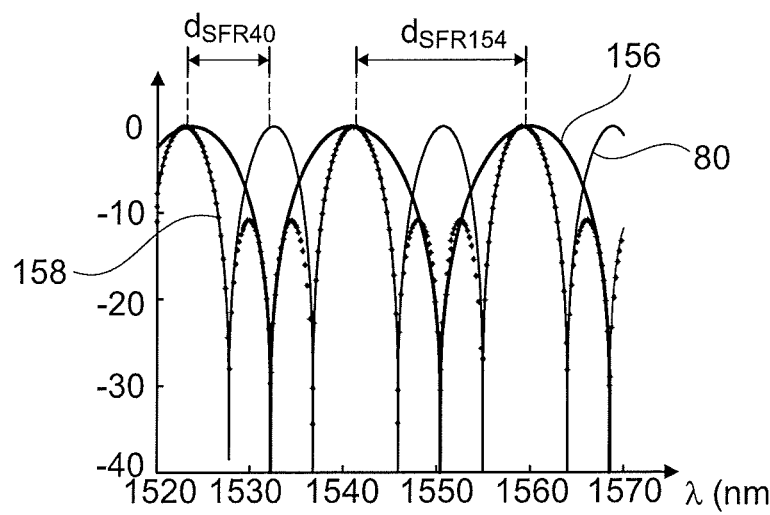
FIG. 9 is a graph illustrating the transmission spectrum of filters of the laser source of FIG. 8.

The filter 154 is an athermal filter the transmission spectrum 156 of which (FIG. 9) comprises a plurality of passbands that are regularly spaced apart from one another by a distance $d_{SFR154}$. Preferably, the filter 154 is arranged so that the distance $d_{SFR154}$ is equal to $p.d_{SFR40}$, where p is an integer number higher than or equal to 2.

In addition, the filter 154 is arranged so that at least one transmission maximum of its spectrum 156 is coincident with a transmission maximum of the spectrum 80 of the filter 40. Under these conditions, the distance between two consecutive maximums of the transmission spectrum 158 (FIG. 9) of the filter 152 is equal to the distance $d_{SFR154}$. The width $\Delta\lambda_{152}$ of the passband of the filter 152 remains equal to the width $\Delta\lambda_{40}$ of a passband of the filter 40. Thus, the use of the filter 154 allows the passbands of the filter 152 to be spaced apart without increasing the width of these passbands. This therefore allows a number of wavelengths $\lambda_{Li}$ lower than the number of wavelengths $\lambda_{Li}$ selected by the filter 22 of the laser source 10 to be selected. By virtue of this, the laser source 150 may be made monomode.

Here, the filter 154 is an athermal Mach-Zehnder interferometer. For example, the filter 154 is identical to the filter 40 except that:
- it is devoid of gain-generating section comprising a core made of gain medium,
- the various sections are adjusted to meet conditions (1) and (2) and in addition to obtain a distance $d_{SFR154}$ equal to p times the distance $d_{SFR40}$.

Thus, the arm 44 of the filter 154 comprises a single section $S_{1,1}$ between the forks 48 and 50. This section $S_{1,1}$ is a waveguide the core of which is made of silicon. This section $S_{1,1}$ is identical, for example, to the concatenation of sections $S_{1,1}$ and $S_{1,3}$ of filter 40. The arm 46 of the filter 154 comprises three consecutive sections $S_{2,1}$, $S_{2,2}$ and $S_{2,3}$. Sections $S_{2,1}$, $S_{2,2}$ and $S_{2,3}$ of the filter 154 are for example identical to sections $S_{2,1}$, $S_{2,3}$ and $S_{2,4}$ of the filter 40, respectively.

Figure 10:
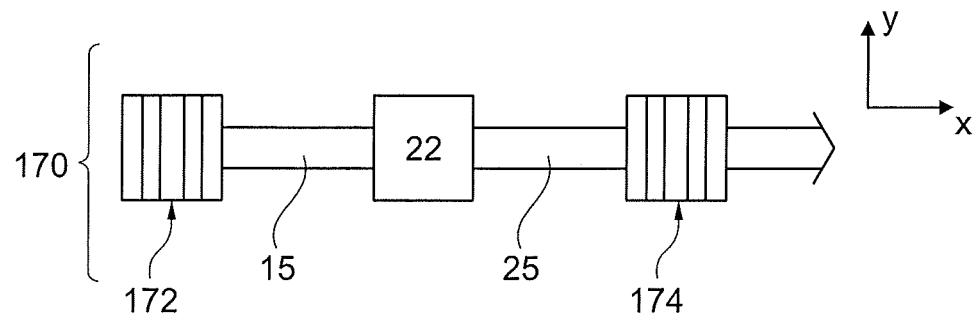

FIG. 10 shows a laser source 170 that is identical to the laser source 10, except that the reflectors 12 and 14 have been replaced by the reflectors 172 and 174, respectively. The reflectors 172 and 174 are reflectors the reflective bands of which are narrow and narrower than the reflective bands of the reflectors 12 and 14. Here, the width of the reflective bands of the reflectors 172 and 174 is comprised between $\Delta\lambda_R$ and $d_{SFR40}$. Thus, the reflectors 172 and 174 permit only wavelengths $\lambda_{Rj}$ contained in the interior of a single passband of the filter 22. The reflectors 172 and 174 are, for example, Bragg gratings. The production of such narrow-reflective-band reflectors is for example described in the following article: G. H. Duan et al.: "Hybrid III-V on Silicon Lasers for Photonic Integrated Circuits on Silicon", Journal of Selected Topics in Quantum Electronics, vol. 20, n° 4, July 2014, pages 1-13.

Preferably, the reflectors 172 and 174 are also insensitive to temperature variations. For example, to this end, the core of the reflectors 172 and 174 is made from a material of low thermo-optical coefficient such as silicon nitride.

Figure 11:
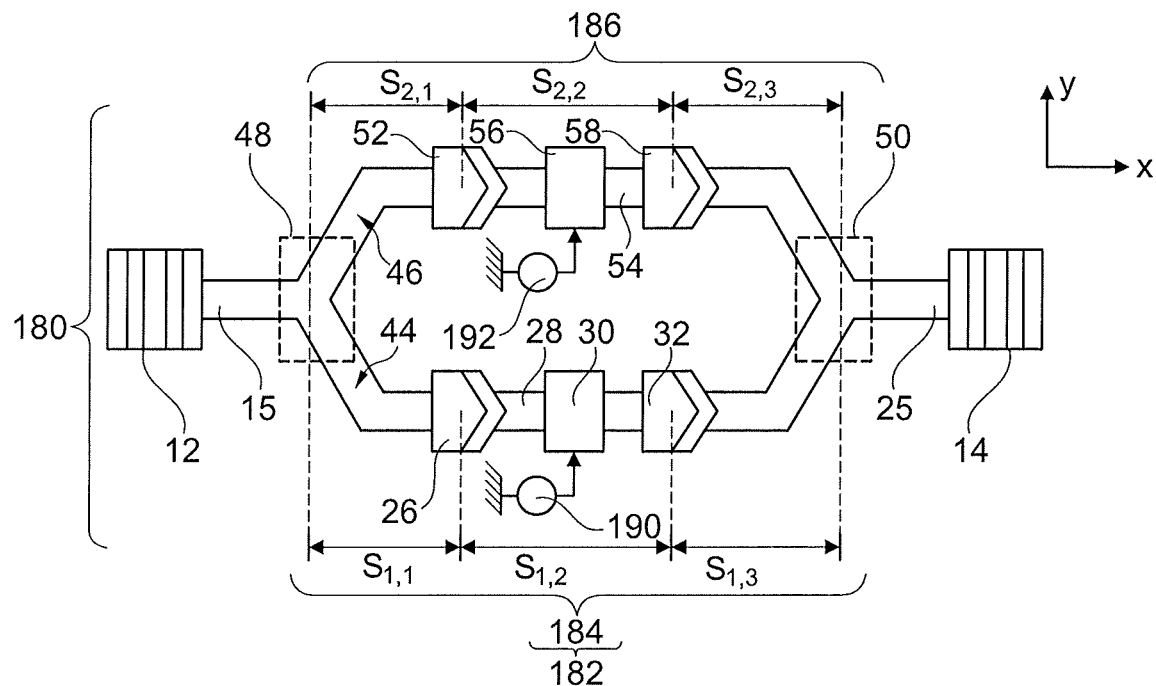

FIG. 11 shows a laser source 180 that is identical to the laser source 10, except that the filter 22 has been replaced by a filter 182 in which the primary filter 40 has been replaced by a primary filter 184. The filter 184 is identical to the filter 40 except that the interferometer 42 has been replaced by an interferometer 186. The interferometer 186 is identical to the interferometer 42 except that the arm 46 is structurally identical to the arm 44. Thus, the arm 46 comprises only three consecutive sections $S_{2,1}$, $S_{2,2}$ and $S_{2,3}$. These sections $S_{2,1}$, $S_{2,2}$ and $S_{2,3}$ of the interferometer 186 are identical to sections $S_{1,1}$, $S_{1,2}$ and $S_{1,3}$ of the arm 44 of the same interferometer, respectively. Under these conditions, the total lengths of the arms 44 and 46 are equal. In addition, the transverse dimensions of the cores of sections $S_{1,2}$ and $S_{2,2}$ are identical. Here, by "transverse dimensions", what is meant is the dimensions in a plane orthogonal to the direction of propagation of the optical signal. It is therefore in particular a question of the width and height of the core.

In contrast, in this embodiment, the injection currents $I_1$ and $I_2$ that flow through the amplifiers 30 and 56, respectively, are not identical. To this end, here, the connections 37 of the amplifiers 30 and 56 are electrically connected to respective power sources 190 and 192. Under these conditions, even though sections $S_{1,2}$ and $S_{2,2}$ are structurally identical, their effective indices $neff_{1,2}$ and $neff_{2,2}$ are different. Specifically, since the magnitudes of the currents $I_1$ and $I_2$ are different, the temperatures of the amplifiers 30, 56 are different and therefore their effective indices are different. Here, the sources 190 and 192 are adjusted so the condition (1) is met. In the particular case of the laser source 180, condition (1) is then written in the following form:

$$L_{2,2}neff_{2,2} - L_{1,2}neff_{1,2} = k_j\lambda_{Si}$$

where the lengths $L_{2,2}$ and $L_{1,2}$ are equal.

Since sections $S_{1,2}$ and $S_{2,2}$ are structurally identical, the coefficients $dneff_{1,2}/dT$ and $dneff_{2,2}/dT$ are equal. Thus, condition (2) described above is also met provided that the lengths $L_{2,2}$ and $L_{1,2}$ are equal. Therefore, the primary filter 184 is also athermal. The way in which the laser source 180 works may be deduced from the explanations given with respect to the laser source 10.

Figure 12:
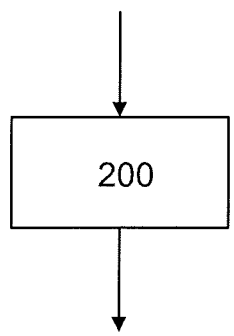
FIG. 12 is a flowchart of a method for emitting an optical signal at a wavelength $\lambda_{Li}$ using the laser source of FIG. 11.

More precisely, as shown in FIG. 12, in a step 200 of emitting an optical signal at the wavelength $\lambda_{Li}$ close to the desired wavelength $\lambda_{Si}$ the sources 190 and 192 inject the currents $I_1$ and $I_2$ of different magnitudes through the amplifiers 30 and 56, respectively.

Figure 13:
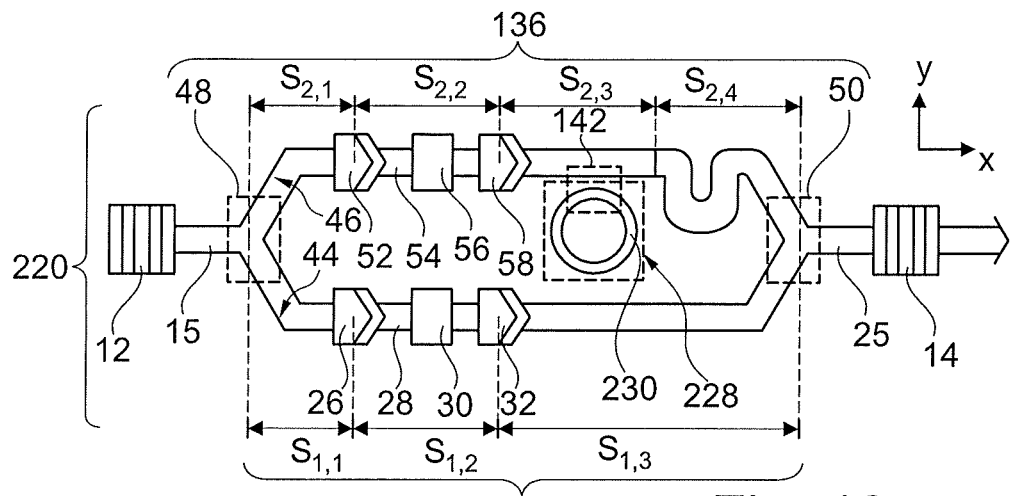

FIG. 13 shows a laser source 220 that is identical to the laser source 130 except that the bandpass filter 132 has been replaced by a bandpass filter 222. The filter 222 is identical to the filter 132 except that the primary filter 134 has been replaced by a primary filter 224. The primary filter 224 is identical to the primary filter 134 except that the secondary filter 138 has been replaced by a secondary filter 228. The filter 228 is identical to the filter 138 except that the ring 140 has been replaced by a ring 230. The ring 230 is configured so that:

the width $\Delta\lambda_{228}$ of each passband of the filter 228 is equal to $\Delta\lambda_R$, a maximum of the transmission spectrum 234 (FIG. 14) of the filter 228 coincides with a maximum of the transmission spectrum 152 of the interferometer 136, and the distance $d_{FSR228}$ between two consecutive maximums of the spectrum 234 (FIG. 14) is equal to $p.d_{SFR136}$, where p is an integer number.

Figure 14:
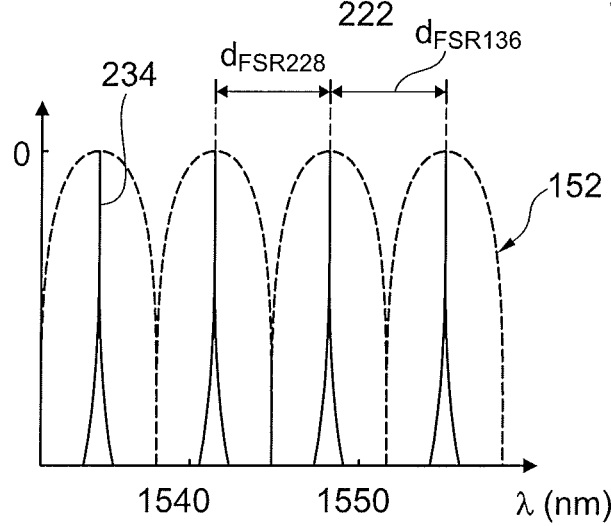
FIG. 14 is a graph illustrating the transmission spectrum of filters of the laser source of FIG. 13.

FIG. 14 shows the transmission spectra 152 and 234 in the particular case where p is equal to 1. As illustrated in FIG. 14, the filter 222 simultaneously selects a plurality of wavelengths $\lambda_{Li}$ that are separated from one another by the distance $d_{FSR228}$. The laser source 220 is therefore multimode.

Figure 15:
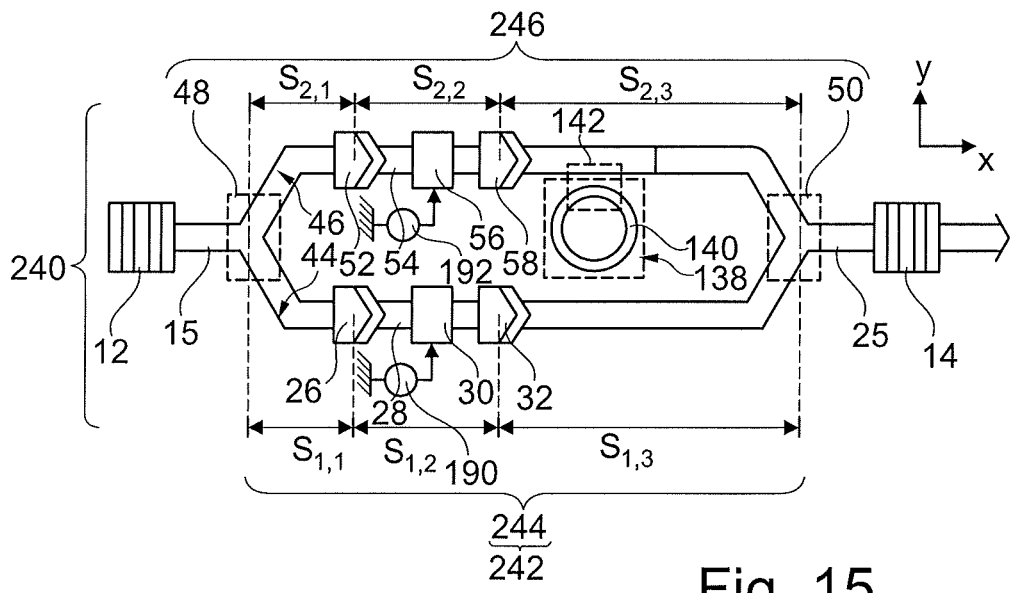

FIG. 15 shows a laser source 240 that is a combination of the embodiments of FIGS. 5 and 11. The laser source 240 is identical to the laser source 130 except that the bandpass filter 132 has been replaced by a bandpass filter 242. The filter 242 is identical to the filter 132 except that the primary filter 134 has been replaced by a primary filter 244. The primary filter 244 is identical to the primary filter 134 except that the interferometer 136 has been replaced by an interferometer 246.

The interferometer 246 is identical to the interferometer 186 except that the lengths $L_{1,2}$ and $L_{2,2}$ are different. As described above with reference to FIG. 11, the magnitudes of the DC currents $I_1$ and $I_2$ are different. Thus, the effective indices $neff_{1,2}$ and $neff2,2$ are different. In contrast, the coefficients $dneff1,2/dT$ and $dneff2,2/dT$ are equal since the materials and the cross section of the cause of sections $S_{1,2}$ and $S_{2,2}$ are identical. In this particular case, condition (1) is then written in the following form:

$$L_{2,2}neff_{2,2} - L_{1,2}neff_{1,2} = k_j\lambda_{Si}$$

Condition (3) for the primary filter 244 to be athermal is written in the following simplified form:

$$L_{min} - \frac{dneff_{138}}{dT} \leq L_{2,2}\frac{dneff_{2,2}}{dT} - L_{1,2}\frac{dneff_{1,2}}{dT} \leq L_{max} - \frac{dneff_{138}}{dT}$$

where the coefficients $dneff_{1,2}/dT$ and $dneff_{2,2}/dT$ are equal.

To find the magnitudes of the currents $I_1$ and $I_2$ and the lengths $L_{1,2}$ and $L_{2,2}$ that meet the above conditions (1) and (3), it is possible, for example, to first set the magnitudes of the currents $I_1$ and $I_2$ and then to seek the lengths $L_{1,2}$ and $L_{2,2}$ that meet the above conditions. It is also possible to proceed in the opposite way, i.e. for the lengths $L_{1,2}$ and $L_{2,2}$ to be set first and then the magnitudes of the currents $I_1$ and $I_2$ sought.

In the embodiment of FIG. 15, the tuning device 144 has been omitted.

SECTION III: VARIANTS

Variants of the Bandpass Filter:

As a variant, the laser source comprises a plurality of primary filters that are connected in series one after the other.

In another embodiment, the primary filter is not athermal. In this case, the various sections $S_{m,n}$ have no need to be arranged to meet condition (2) or (3). If the primary filter is not athermal and this primary filter is connected in series with a tertiary filter, this tertiary filter is itself also not athermal. More precisely, in this case, the tertiary filter is arranged so that its coefficient $d\lambda_{CF3}/dT$ is equal or practically equal to the coefficient $d\lambda_{CF1}/dT$ of the primary filter.

The optical coupling 142 between the ring 140 and the arm 46 may occur elsewhere. For example, as a variant, this optical coupling occurs between section $S_{2,1}$ or $S_{2,4}$ and the ring 140, or even between section $S_{2,2}$ and the ring 140.

A tertiary filter such as the filter 154 may be implemented in the other embodiments described here and, in particular, in the embodiments of FIGS. 1, 4, 5, 10, 11 and 13.

Other embodiments of the tertiary filter are possible. For example, as a variant, the tertiary filter is identical to the primary filter 134 but the sections $S_{1,2}$ and $S_{2,2}$ comprising gain media are omitted. In another example embodiment, the tertiary filter is made athermal not using a Mach-Zehnder interferometer but using other means. For example, the core of the tertiary filter is made from a material the thermo-optical coefficient of which is low, i.e. at least two times lower than the thermo-optical coefficient of silicon. Thus, in another example, the tertiary filter is a ring resonator formed in a waveguide made of silicon nitride and coupled to the waveguide 15 or 25.

Other embodiments of the secondary filter 138 are possible. More precisely, any other filter having a transmission spectrum similar to the spectrum 150 and capable of being optically coupled to one of the sections of the arm 46 may be employed.

The secondary filter may also be produced in waveguides the core of which is made from a material the thermo-optical coefficient of which is low. For example, as a variant, the filter 138 is produced in a waveguide the core of which is made of silicon nitride and the cladding of which is made of silicon oxide.

Other Variants:

The fact of injecting currents $I_1$ and $I_2$ of different magnitudes into the amplifiers 30 and 56 may be implemented in all the embodiments described here. In particular, currents $I_1$ and $I_2$ of different magnitudes may be injected through the amplifiers 30 and 56 of the embodiments of FIGS. 1, 4, 5, 8, 10 and 13. In this case, the other sections of the arms 44 and 46 are arranged so that conditions (1) and (2) or conditions (1) and (3) are met. The way in which these variants work is then the same as that of the laser source 180.

In the laser source 180, it is not necessary for sections $S_{1,1}$ and $S_{1,3}$ to be identical to sections $S_{2,1}$ and $S_{2,3}$, respectively. For example, as a variant, section is longer than section $S_{2,1}$ and, to compensate, section $S_{1,3}$ is shorter than section $S_{2,3}$. In fact, it is enough for the following condition (4) to be met for the laser source 180 to operate correctly: $L_{1,1}neff_{1,1}+L_{1,3}neff_{1,3}=L_{2,1}neff_{2,1}+L_{2,3}neff_{2,3}$. This condition (4) may be generalized without difficulty to the case where each arm comprises more than three sections $S_{m,n}$.

In the laser source 180, if it is not necessary for the bandpass filter to be athermal, then it is also not necessary for the lengths $L_{1,2}$ and $L_{2,2}$ to be equal. In this case, the laser source 108 operates correctly provided that sections $S_{1,2}$ and $S_{2,2}$ are configured so that the following condition is met:

$$L_{2,2}neff_{2,2} - L_{1,2}neff_{1,2} = k_j\lambda_{Si}$$

The above condition may be met even with different lengths $L_{1,2}$ and $L_{2,2}$.

The core of the gain-generating sections such as sections $S_{1,2}$ and $S_{2,2}$ may be produced using other materials. For example, the stack 34 may also be a stack of sublayers in alternation made of InP and InGaAsP. As a variant, the gain medium is deposited directly on an extension made of silicon of the waveguide 15 or 25. This superposition of the gain medium on the extension made of silicon then forms the core of an optical-gain-generating waveguide. In this case, the optical-gain-generating waveguide comprises III-V material but also silicon.

There are also other embodiments of the resonant cavity and, in particular, embodiments devoid of reflectors. For example, the cavity may take the form of a ring in which the optical signal rotates in such a way as, in each rotation, to pass through the gain medium of the interferometer. For example, this amounts to replacing the reflectors 12 and 14 with an additional waveguide that connects the left end of the resonant cavity to the right end while circumventing the gain media. In this case, the additional waveguide is, for example, produced in the layer 72.

Whatever the embodiment described here, to limit the consequences of the shift in the reflective band of the reflectors as a function of temperature, these reflectors may be made from a material of low thermo-optical coefficient such as silicon nitride.

The reflectors are not necessarily Bragg gratings. For example, a reflector may also be produced using a Sagnac loop.

Lastly, the system allowing the variations in the wavelength $\lambda_{Li}$ as a function of temperature to be limited is not necessarily a passive system as described in the preceding embodiments. Thus, as a variant, the laser source may comprise:
- a tuning device able to move the wavelengths $\lambda_{Rj}$ as a function of an electrical control signal,
- a sensor able to measure a physical quantity representative of the difference between the wavelength $\lambda_{Cf}$ of the bandpass filter and the closest of the wavelengths $\lambda_{Rj}$, and
- an electronic circuit able to generate the electrical control signal so as to permanently keep one of the wavelengths $\lambda_{Rj}$ at the centre of the passband of the bandpass filter.

The wavelength $\lambda_{Cf}$ of the bandpass filter corresponds to a maximum of the transmission spectrum of this filter. Embodiments and implementations of these various components in a laser source are, for example, identical to those described in patent application US20180261976A.

SECTION IV: ADVANTAGES OF THE EMBODIMENTS

The fact of producing the gain-generating waveguide in each of the arms of an interferometer allows the length of the resonant cavity to be substantially decreased with respect to the case of a resonant cavity that allows an identical optical signal of the same power to be generated, but in which the gain-generating waveguide is located outside of the bandpass filter. Specifically, here, the functions of filtering and amplifying the optical signal are interleaved and carried out by one and the same component, namely a Mach-Zehnder interferometer. Thus, at equal characteristic and, in particular, at equal power, the resonant cavity of the laser sources described here is much shorter. This therefore allows, at equal characteristic, the bulk of the laser source to be decreased.

The fact of using a Mach-Zehnder interferometer arranged so as to meet condition (2) or (3) allows the movement of the passband of this filter as a function of temperature to be limited. This limits the variations in the wavelength $\lambda_{Li}$ as a function of temperature. In particular, this limitation is obtained without it being necessary to make some of this bandpass filter from materials of low thermo-optical coefficient such as silicon nitride. Production of this bandpass filter is therefore simpler. In addition, the limitation of the movement of the passband of the filter as a function of temperature that it is possible to obtain is better than the limitation that it is possible to obtain by making, at least partially, the bandpass filter from materials of low thermo-optical coefficient.

When the arms of the interferometer comprise no optical coupling with a secondary filter such as the filter 138 and when this interferometer is arranged to meet condition (2), its transmission spectrum varies very little as a function of temperature. Therefore, the position of the passband of its transmission spectrum is practically constant. By virtue of this, it is possible to limit the variations in the wavelength $\lambda_{Li}$ of the laser source as a function of temperature.

When the arm of the interferometer comprises an optical coupling with a secondary filter such as the filter 138 and when this interferometer is arranged to meet condition (3), the obtained primary filter is also athermal. Thus, this embodiment of the bandpass filter for its part also allows the variations in the wavelength $\lambda_{Li}$ as a function of temperature to be limited. In addition, the secondary filter allows the width of the one or more passbands of the bandpass filter to be decreased or certain passbands to be limited with respect to the case where this bandpass filter is devoid of such a secondary filter. This therefore allows a monomode laser source to be obtained The fact that the secondary filter is a ring resonator allows the bulk of the laser source to be decreased.

The use of an athermal tertiary filter connected in series with the primary filter allows the passbands of the bandpass filter to be spaced apart while preserving small variations in the wavelength $\lambda_{Li}$ as a function of temperature.

The use of an athermal Mach-Zehnder interferometer to produce the tertiary filter allows a tertiary filter the spectrum of which varies very little as a function of temperature to be obtained and therefore the variations in the wavelength $\lambda_{Li}$ as a function of temperature to be very effectively limited.

The fact that the width of the passband of the bandpass filter is smaller than or equal to the interval $\Delta\lambda_R$ allows a monomode laser source to be obtained. In contrast, the fact that the width of the passband of the bandpass filter is larger than the interval $\Delta\lambda_R$ allows a multimode laser source to be obtained.

The use of reflectors the reflective band of which is narrow allows a monomode laser source to be obtained.

The presence in the transmission spectrum of the bandpass filter of a plurality of passbands spaced apart from one another by an interval equal to an integer multiple of the interval $\Delta\lambda_R$ allows a multimode laser source to be obtained.

The fact that the passband of the bandpass filter has a width substantially identical to the interval $\Delta\lambda_R$ allows a passive thermal stabilization of the wavelength $\lambda_{Li}$ to be obtained. Specifically, if following heating of the resonant cavity the wavelength $\lambda_{Rj}$ selected by the bandpass filter moves and exits from this passband, at the same time the preceding wavelength $\lambda_{Rj-1}$ or the following wavelength $\lambda_{Rj+1}$ enters into the interior of this passband. Thus, even in the absence of an active component for keeping one of the wavelengths $\lambda_{Rj}$ at the centre of the passband of the bandpass filter, the variations in the wavelength $\lambda_{Li}$ as a function of temperature are limited.

Advantages of the Currents $I_1$ and $I_2$ of Different Magnitudes:

The fact of injecting currents $I_1$ and $I_2$ of different magnitudes into the amplifiers 30 and 56 makes it possible to obtain sections $S_{1,2}$ and $S_{2,2}$ the effective indices of which are different without having to modify the transverse dimensions of these sections or the materials from which they are made. This therefore simplifies the production of the bandpass filter.

If, in addition, the arms 44 and 46 are structurally identical and these arms are not coupled to a secondary filter, then the simple fact of meeting condition (1) necessarily leads to condition (2) being met. This therefore facilitates the production of a primary filter that is in addition athermal.

The invention claimed is:

1. A semiconductor laser source configured to emit at a wavelength $\lambda_{Li}$ close to a desired wavelength $\lambda_{Si}$, this laser source comprising:
a set of waveguides optically coupled to one another and forming an optical cavity able to make an optical signal resonate at a plurality of possible resonant frequencies, the possible wavelengths $\lambda_{Rj}$ of these possible resonant frequencies being regularly spaced apart from one another by an interval $\Delta\lambda_R$, this set comprising:
at least one waveguide in which a bandpass filter is produced, the transmission spectrum of this bandpass filter comprising a passband able to select, among the various possible wavelengths $\lambda_{Rj}$, the wavelength $\lambda_{Li}$ closest to the wavelength $\lambda_{Si}$, and
at least one gain-generating waveguide able to generate optical gain at each wavelength $\lambda_{Li}$, selected by the bandpass filter, this gain-generating waveguide comprising a III-V gain medium,
wherein:
the bandpass filter comprises a primary filter containing a Mach-Zehnder interferometer, this interferometer comprising:
first and second arms,
a first fork via which the optical signal is distributed between the first and second arms, and
a second fork via which the optical signals of the first and second arms are combined together,
each of the first and second arms being divided into a plurality of consecutive sections that are immediately contiguous to one another, each section comprising a core able to guide the optical signal and each section having an effective index at the wavelength $\lambda_{Si}$, the effective index of each section located immediately after a preceding section being different from the effective index of this preceding section,
the lengths of the various sections of the first and second arms meeting the following condition:

$$\sum_{n=1}^{N_2} L_{2,n} neff_{2,n} - \sum_{n=1}^{N_1} L_{1,n} neff_{1,n} = k_f \lambda_{Si}$$

where:
$k_f$ is a preset integer number higher than or equal to 1,
$N_1$ and $N_2$ are the numbers of sections in the first and second arms, respectively,
$L_{1,n}$ and $L_{2,n}$ are the lengths of the nth sections of the first and second arms, respectively,
$neff_{1,n}$ and $neff_{2,n}$ are the effective indices of the nth sections of the first and second arms, respectively,
wherein the first and second arms each comprise a gain-generating section, the cores of each of these gain-generating sections being made from the same III-V gain medium, these gain-generating sections thus forming first and second gain-generating waveguides, respectively.

2. The source according to claim 1, wherein:
the primary filter comprises a secondary filter the transmission spectrum of which comprises a narrow passband located in the interior of a wider passband of the interferometer, this secondary filter having a coefficient $d\lambda_{CF2}/dT$ higher than $L_{max}$, where:
$\lambda_{CF2}$ is the wavelength corresponding to a maximum of the transmission spectrum of the secondary filter,
the coefficient $d\lambda_{CF2}/dT$ is the variation in the wavelength $\lambda_{CF2}$ as a function of temperature, and
$L_{max}$ is equal to 50 pm/° C. or 15 pm/° C.,
one of the first and second arms of the interferometer comprises an optical coupling to the secondary filter, and
the lengths of the various sections of the first and second arms are such that a coefficient $d\lambda_{CMZI}/dT$ is comprised between $-d\lambda_{CF2}/dT + L_{min}$ and $-d\lambda_{CF2}/dT + L_{max}$, where:
$\lambda_{CMZI}$ is a wavelength corresponding to a maximum of the transmission spectrum of the interferometer,
the coefficient $d\lambda_{CMZI}/dT$ is the variation in the wavelength $\lambda_{CMZI}$ as a function of temperature,
$L_{min}$ is equal to −50 pm/° C. or −15 pm/° C., and
$L_{max}$ is equal to +50 pm/° C. or +15 pm/° C.

3. The source according to claim 2, wherein the secondary filter comprises a ring resonator optically coupled to one of the first and second arms of the interferometer, the narrow passband of the transmission spectrum of this ring resonator being centred on the wavelength $\lambda_{CMZI}$ and having a width $\Delta\lambda_{F2}$ smaller than or equal to the interval $\Delta\lambda_R$.

4. The source according to claim 3, wherein the laser source also comprises a tuning device configured to shift the narrow passband of the secondary filter with respect to the passband of the interferometer in response to an electrical control signal.

5. The source according to claim 1, wherein:
none of the arms of the interferometer comprises an optical coupling to a secondary filter,
the lengths of the various sections of the first and second arms are such that a coefficient $d\lambda_{CMZI}/dT$ is comprised between $L_{min}$ and $L_{max}$ in a temperature range extending from 20° to 100°, where:
$\lambda_{CMZI}$ is a wavelength corresponding to a maximum of the transmission spectrum of the interferometer,
the coefficient $d\lambda_{CMZI}/dT$ is the variation in the wavelength $\lambda_{CMZI}$ as a function of temperature,
$L_{min}$ is equal to −50 pm/° C. or −15 pm/° C., and
$L_{max}$ is equal to +50 pm/° C. or +15 pm/° C.

6. Source The source according to claim 5, wherein the lengths of the sections of the first and second arms meet the following athermicity condition for the wavelength $\lambda_{Si}$ and in a temperature range extending from 20° to 100° C.:

$$L_{min} \leq \sum_{n=1}^{N_2} L_{2,n} \frac{dneff_{2,n}}{dT} - \sum_{n=1}^{N_1} L_{1,n} \frac{dneff_{1,n}}{dT} \leq L_{max}$$

where $dneff_{1,n}/dT$ and $dneff_{2,n}/dT$ are the variations in the effective indices of the nth sections of the first and second arms, respectively.

7. The source according to claim 1, wherein:
the bandpass filter comprises a tertiary filter that is optically connected in series with the primary filter, the transmission spectrum of this tertiary filter comprising a plurality of passbands that are spaced apart from one another by a distance $d_{SFR154}$ at least two times larger than a distance $d_{SFR40}$, where the distance $d_{SFR40}$ is the distance that separates from one another the passbands of the transmission spectrum of the interferometer of the primary filter, this tertiary filter has a coefficient $d\lambda_{CF3}/dT$ comprised between $L_{min}$ and $L_{max}$, where:

$\lambda_{cF3}$ is a wavelength corresponding to a maximum of the transmission spectrum of the tertiary filter, the coefficient $d\lambda_{CF3}/dT$ is the variation in the wavelength $\lambda_{CF3}$ as a function of temperature, $L_{min}$ is equal to $-50$ pm/° C. or $-15$ pm/° C., and $L_{max}$ is equal to $+50$ pm/° C. or $+15$ pm/° C.

8. The source according to claim 7, wherein the tertiary filter comprises one or more additional Mach-Zehnder interferometers that are optically coupled together in series one after another.

9. The source according to claim 2, wherein:

the passbands of the secondary or tertiary filter are spaced apart from one another by a distance such that there exists, in the interior of an interval $\Delta R$, only a single passband of the secondary or tertiary filter centred on a transmission maximum of the transmission spectrum of the interferometer of the primary filter, where the interval $\Delta R$ is the smallest wavelength range containing all the possible wavelengths $\lambda_{Rj}$ permitted by the resonant cavity, and the width of the passband of the secondary or tertiary filter centred on the transmission maximum of the transmission spectrum of the interferometer of the primary filter is smaller than or equal to the interval $\Delta\lambda_R$.

10. The source according to claim 2, wherein:

the passbands of the secondary or tertiary filter are separated from one another by a distance equal to an integer multiple of the interval $\Delta\lambda_R$ and smaller than an interval $\Delta R$, where the interval $\Delta R$ is the smallest wavelength range containing all the possible wavelengths $\lambda_{Rj}$ permitted by the resonant cavity, and a passband of the secondary or tertiary filter is centred on a transmission maximum of the transmission spectrum of the interferometer of the primary filter.

11. The source according to claim 1, wherein:

the laser source comprises a front reflector and a back reflector forming ends of the resonant optical cavity, and hence the optical cavity is a Fabry-Perot cavity, these reflectors each having:

a reflective band the width of which is smaller than or equal to 10 nm or 4 nm, a coefficient $d\lambda_{CR}/dT$ comprised between $L_{min}$ and $L_{max}$, where:

$\lambda_{CR}$ is a wavelength corresponding to a maximum of the reflection spectrum of the reflector, the coefficient $d\lambda_{CR/dT}$ is the variation in the wavelength $\lambda_{CR}$ as a function of temperature, $L_{min}$ is equal to $-50$ pm/° C. or $-15$ pm/° C., and $L_{max}$ is equal to $+50$ pm/° C. or $+15$ pm/° C.

12. The source according to claim 11, wherein each reflector comprises a core encapsulated in a cladding, this core being configured to reflect the optical signal, and the core of the front and back reflectors is made from silicon nitride.

13. The source according to claim 1, wherein:

the first arm is shorter than the second arm, the first arm comprises only a first section, a second section and a third section, the second arm comprises only a first section, a second section, a third section and a fourth section, the first sections of the first and second arms have the same coefficient $dneff_{2,1}/dT$, the second sections of the first and second arms have identical lengths and are made from the same III-V gain medium, the effective index and the coefficient $dneff_{2,2}/dT$ of these second sections being identical, the third section of the second arm has a coefficient $dneff_{2,3}/dT$ lower than the coefficients $dneff_{2,1}/dT$ and $dneff_{2,2}/dT$ of the first and second sections, respectively, the third section of the first arm and the fourth section of the second arm have different lengths and have the same effective index and the same coefficient $dneff_{2,4}/dT$, where:

the coefficient $dneff_{2,n}/dT$ is the variation in the effective index of the nth section of the second arm, and n is a numerical order of the section of the arm.

14. The source according to claim 1, wherein:

the first arm is shorter than the second arm, the first arm comprises only a first section, a second section and a third section, the second arm comprises only a first section, a second section and a third section, the first sections of the first and second arms have the same effective index and the same coefficient $dneff_{2,1}/dT$, the second sections of the first and second arms are made from the same III-V gain medium, the effective index and the coefficient $dneff_{2,1}/dT$ of these second sections being identical and the length of the second section of the second arm being larger than the length of the second section of the first arm, the third sections of the first and second arms have different lengths and have the same effective index and the same coefficient $dneff_{2,3}/dT$, where:

the coefficient $dneff_{2,n}/dT$ is the variation in the effective index of the nth section of the second arm, and n is a numerical order of the section of the arm.

* * * * *

UNITED STATES PATENT AND TRADEMARK OFFICE
CERTIFICATE OF CORRECTION

PATENT NO. : 11,038,319 B2
APPLICATION NO. : 16/683402
DATED : June 15, 2021
INVENTOR(S) : Wilmart et al.

Page 1 of 1

It is certified that error appears in the above-identified patent and that said Letters Patent is hereby corrected as shown below:

In the Claims

In Column 17, Claim 1, Line 26, delete "$\lambda_{Li}$," and insert -- $\lambda_{Li}$ --, therefor.

In Column 17, Claim 1, Line 58, delete "$L_{1,n}$," and insert -- $L_{1,n}$ --, therefor.

In Column 19, Claim 7, Line 8, delete "$\lambda_{cF3}$" and insert -- $\lambda_{CF3}$ --, therefor.

In Column 19, Claim 11, Line 53, delete "$d\lambda_{CR/dT}$" and insert -- $d\lambda_{CR}/dT$ --, therefor.

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*